United States Patent
Cai et al.

(10) Patent No.: US 6,183,026 B1
(45) Date of Patent: Feb. 6, 2001

(54) END EFFECTOR

(75) Inventors: Lihong Cai, Fremont; Douglas MacDonald, Los Gatos, both of CA (US)

(73) Assignee: GaSonics International Corporation, San Jose, CA (US)

( * ) Notice: Under 35 U.S.C. 154(b), the term of this patent shall be extended for 0 days.

(21) Appl. No.: 09/287,325

(22) Filed: Apr. 7, 1999

(51) Int. Cl.$^7$ .................................................. B25J 15/06
(52) U.S. Cl. ............................................ 294/64.1; 901/40
(58) Field of Search ..................................... 294/1.1, 64.1, 294/64.3; 29/743; 269/21; 414/627, 727, 752, 935, 937, 941; 901/27, 30, 40

(56) References Cited

U.S. PATENT DOCUMENTS

| | | | |
|---|---|---|---|
| 4,428,815 | * | 1/1984 | Powell et al. .................. 294/64.1 X |
| 4,687,242 | * | 8/1987 | Van Rooy ........................... 294/64.1 |
| 4,736,508 | * | 4/1988 | Poli et al. ....................... 294/64.1 X |
| 4,981,315 | * | 1/1991 | Poli et al. ........................... 294/64.1 |
| 5,292,393 | | 3/1994 | Maydan et al. ....................... 156/345 |
| 5,556,147 | * | 9/1996 | Somekh et al. ...................... 294/64.1 |
| 5,569,014 | | 10/1996 | Hofmeister ........................ 414/744.3 |
| 5,622,400 | * | 4/1997 | George .................................. 294/64.1 |
| 5,655,060 | | 8/1997 | Lucas ....................................... 395/85 |
| 5,669,644 | * | 9/1997 | Kaihotsu et al. ................. 414/941 X |
| 5,700,046 | * | 12/1997 | Van Doren et al. .............. 414/941 X |
| 5,765,889 | * | 6/1998 | Nam et al. ........................... 294/64.1 |
| 5,783,834 | * | 7/1998 | Shatas ............................... 414/941 X |

FOREIGN PATENT DOCUMENTS

| | | | |
|---|---|---|---|
| 752469 | * | 7/1956 | (GB) ................................... 294/64.1 |
| 33678 | * | 3/1979 | (JP) ..................................... 294/64.1 |
| 62951 | * | 2/1992 | (JP) ...................................... 414/941 |
| 47899 | * | 2/1993 | (JP) ...................................... 414/941 |
| 84682 | * | 4/1993 | (JP) ..................................... 294/64.1 |

* cited by examiner

*Primary Examiner*—Johnny D. Cherry
(74) *Attorney, Agent, or Firm*—Townsend and Townsend and Crew LLP

(57) ABSTRACT

An improved end effector includes an end effector body having a proximal end portion and a distal end portion. A contact member is attached to the top surface of the proximal end portion for supporting a substrate over a contact surface area. The contact member spaces the substrate from the end effector body to reduce the contact area between the end effector and the substrate. The contact member is made of a material with a low thermal conductivity. The reduced contact area and low thermal conductivity serve to decrease heat conduction between the contact member and the substrate so as to reduce a temperature gradient and thermal stresses in the substrate caused by the contact. The end effector body includes a plurality of apertures disposed between the proximal end portion and the distal end portion. At least some of the apertures overlap in position with portions of the substrate to provide open areas between blocked portions of the end effector body which overlap in position with the substrate. The open areas facilitate heat transfer by radiation for the substrate to reduce temperature gradient in the substrate caused by the overlap in position between the end effector body and the substrate.

33 Claims, 2 Drawing Sheets

END EFFECTOR

BACKGROUND OF THE INVENTION

This invention relates to handling of substrates in semiconductor manufacturing and, more particularly, to an improved end effector coupled to a robot mechanism for supporting substrates.

In semiconductor manufacturing, robots are commonly used to move wafers from one location to another. For instance, robots transfer wafers between different reaction chambers for carrying out different processes. Typically, a replaceable end effector or blade is mounted to a robot for supporting a wafer. Examples of wafer handling robot systems can be found in U.S. Pat. Nos. 5,292,303, 5,569,014, and 5,655,060, which are incorporated herein by reference in their entireties.

During processing, a wafer can reach temperatures that are significantly different from the temperature of the end effector. When the end effector comes in contact with the wafer, the temperature differential produces a temperature gradient in the wafer, which can introduce thermal stresses in the wafer and cause cracking and fracture of the wafer. This results in substantial economic loss, particularly for wafers made of GsAs which are more costly than silicon wafers.

SUMMARY OF THE INVENTION

The present invention provides an improved end effector that reduces the thermal stresses caused by temperature differentials between the end effector and the wafer in order to reduce cracking and fracture of the wafer. When two objects at different temperatures come in contact, conduction of heat occurs between them generally according to the following equation:

$$Q = -kA\Delta T$$

where Q is the heat conduction, k is the coefficient of conductivity or thermal conductivity of the material of the reference object, A is the contact area, and $\Delta T$ is the temperature differential between the reference object and the other object.

One way to reduce thermal stresses caused by the contact of two objects at different temperatures is to minimize the heat conduction between them so as to reduce the temperature gradient in the objects. According to the above equation, the heat conduction can be decreased by reducing the thermal conductivity of at least one of the two objects, reducing the contact area, or reducing the temperature differential. Specific embodiments of the present invention decrease the heat conduction by reducing the thermal conductivity of the end effector or reducing the contact area between the wafer and the end effector, or both. This decreases the thermal stresses in the wafer and cracking and fracture of the wafer.

In accordance with an embodiment of the present invention, an end effector for handling a substrate comprises an end effector body having a proximal end portion and a distal end portion. The end effector body includes at least one aperture disposed between the proximal end portion and the distal end portion. A contact member is coupled with the proximal end portion of the end effector body for contacting a substrate over a contact surface area which is smaller in size than the surface of the substrate facing the contact member. The contact member spaces the substrate from the end effector body. The at least one aperture of the end effector body overlaps in position with a portion of the substrate when the substrate is in contact with the contact member. In a specific embodiment, the end effector body includes a plurality of apertures disposed between the proximal end portion and the distal end portion, at least some of which overlap in position with a portion of the substrate when the substrate is supported by the contact member.

In accordance with another embodiment of the invention, an end effector for handling a substrate comprises an end effector body having a proximal end portion and a distal end portion. The end effector body comprising a body material. A support member is coupled with the proximal end portion of the end effector body for supporting a substrate and spacing the substrate from the end effector body. The support member comprises a support member material having a thermal conductivity which is lower than the thermal conductivity of the body material. In a specific embodiment, the body material includes steel and the support member material includes ceramic which has a thermal conductivity of about ⅕ the thermal conductivity of steel.

DESCRIPTION OF THE SPECIFIC EMBODIMENTS

Figure 1:
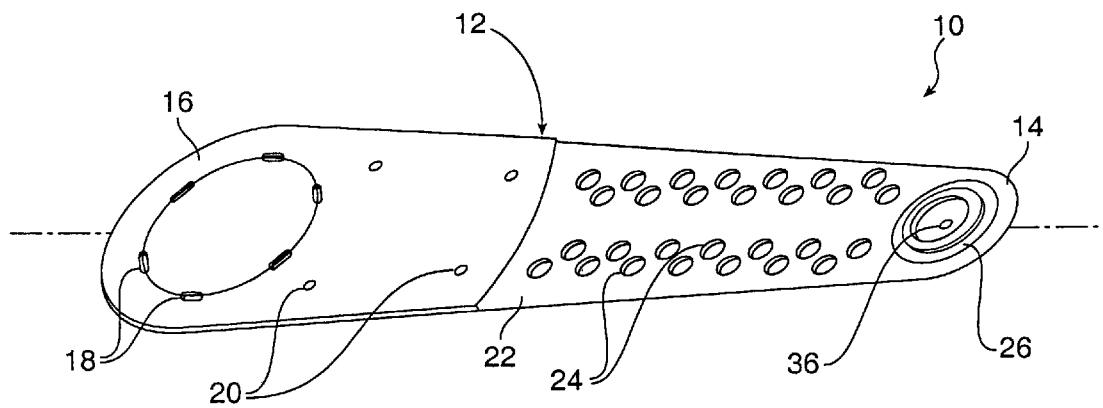
FIG. 1 is a top perspective view of an end effector according to an embodiment of the present invention.
Figure 2:
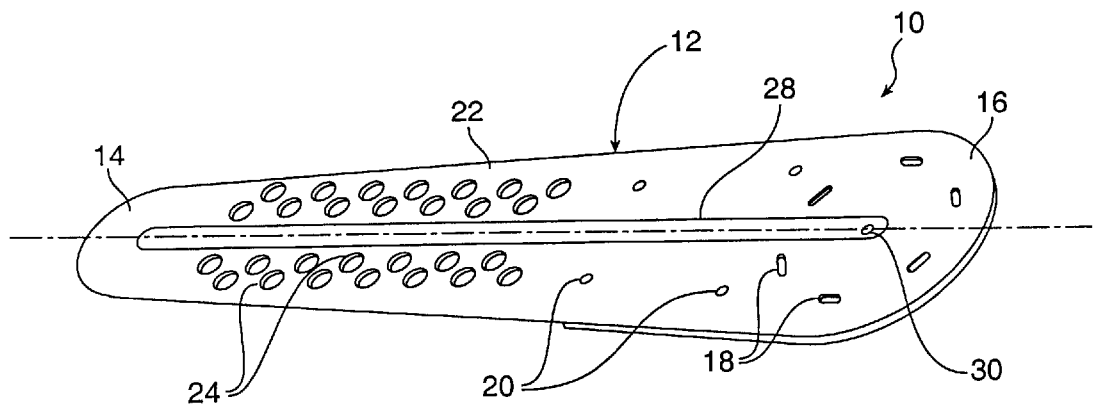
FIG. 2 is a bottom perspective view of the end effector of FIG. 1.
Figure 3A:
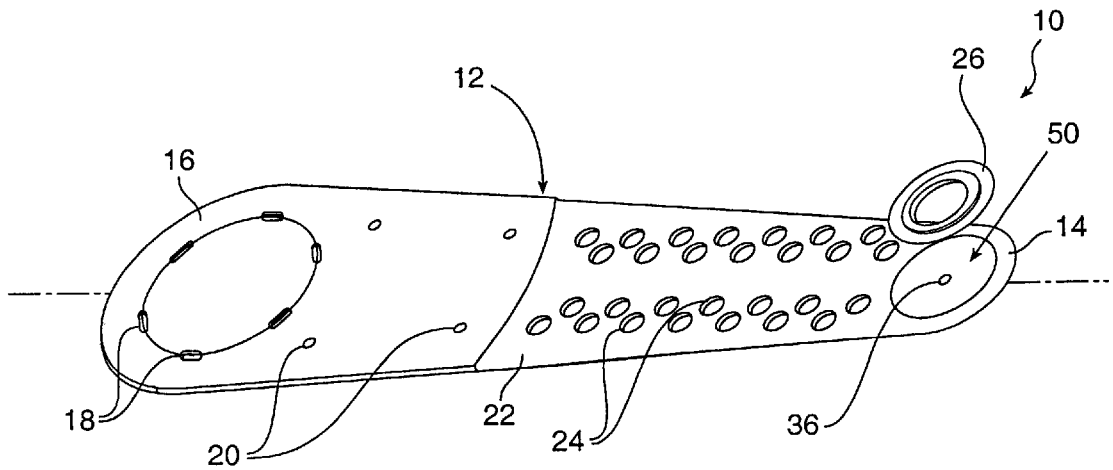
FIG. 3 is an exploded perspective view of the end effector of FIG. 1.
Figure 3B:
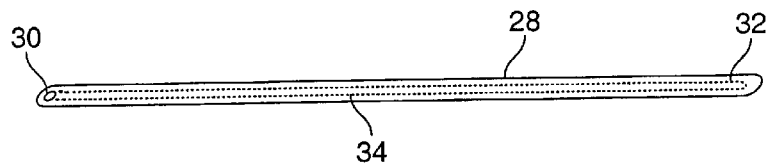

As shown in FIGS. 1–3, an end effector 10 includes an end effector body 12 having a proximal end portion 14 and a distal end portion 16. The distal end portion 16 includes a plurality of slots 18 and holes 20 provided for coupling the distal end portion 16 to a robot (not shown). The end effector body 12 is substantially planar, but the distal end portion 16 typically has a larger thickness than the proximal end portion 14 and the intermediate portion 22 between the distal end portion 16 and the proximal end portion 14. A plurality of apertures 24 are provided in the intermediate portion 22. A contact or support member 26 is disposed on the top surface of the proximal end portion 14. A vacuum strip 28 is provided at the bottom surface of the end effector body 12 and extends from the distal end portion 16 through the intermediate portion 22 to the proximal end portion 14.

As best seen in FIG. 3, the vacuum strip 28 includes a bottom opening 30 disposed at its distal end which corresponds to the distal end portion 16 of the end effector body 12. The bottom opening 30 does not extend through the thickness of the vacuum strip 28 but partly from the bottom of the strip 28. The vacuum strip 28 includes a top opening 32 disposed at its proximal end which corresponds to the proximal end portion 14 of the end effector body 12, and extends partly from the top of the strip 28. The top opening 32 and the bottom opening 30 are in communication with one another through a vacuum channel 34 extending therebetween. As best seen in FIG. 2, the vacuum strip 28 is desirably received into a longitudinal groove or slot at the bottom of the end effector body 12 so that the assembled end effector 10 has a substantially planar bottom surface. The vacuum strip 28 can be attached to the end effector body 12 by any suitable means, such as adhesives. In one embodiment, a thin layer of epoxy is applied around the edge of the longitudinal groove at the bottom of the end effector body 12 and the vacuum strip 28 is placed into the groove. The vacuum strip 28 is attached to the end effector body 12 after the epoxy around the edge settles. The top opening 32 of the vacuum strip 28 is aligned with a vacuum aperture 36 in the proximal end portion 14 of the end effector body 12.

Figure 4:
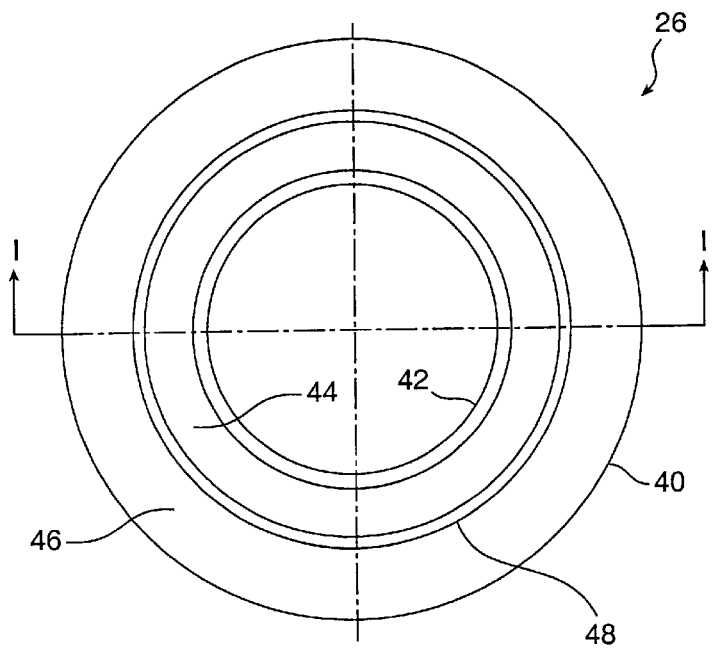
FIG. 4 is a top plan view of a contact member in the end effector of FIG. 1.
Figure 5:
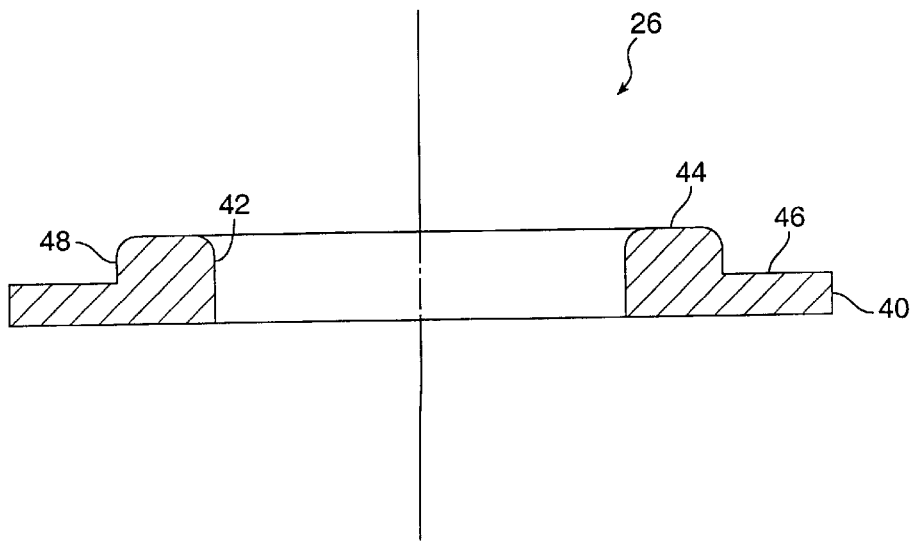
FIG. 5 is a cross-sectional view of the contact member of FIG. 4 along I—I.

Referring to FIGS. 4 and 5, the contact member 26 in a specific embodiment is an annular member with a generally circular outer edge 40 and a generally circular inner edge 42. The top annular surface defined between the outer edge 40 and the inner edge 42 includes a contact surface area 44 and an outer annular area 46 separated by a step 48. The outer annular area 46 has an outer boundary corresponding to the outer edge 40 and an inner boundary corresponding to the step 48. The contact surface area 44 has an outer boundary corresponding to the step 48 and an inner boundary corresponding to the inner edge 42. As best seen in FIG. 5, the contact surface area 44 protrudes from the outer annular area 46 at the step 48. The contact member 26 spaces the substrate from the top surface of the end effector body 12 by a gap to reduce the contact area between the end effector 10 and the substrate. The gap should be sufficiently large so that the substrate is not too close to the surface of the end effector 10, but should not be too large due to constraints of space. The gap is typically about 0.01–0.025 inch. In a specific embodiment, the gap is about 0.0175 inch.

In the embodiment shown, the contact surface area 44 and outer annular area 46 are generally planar and parallel to one another. The height of the step 48 is typically about 0.01–0.025 inch, and the height of the outer annular area 46 measured from the bottom of the contact member 26 is typically about 0.01–0.025 inch.. In a specific embodiment, the step 48 has a height of about 0.0175 inch and the outer annular area 46 has a height of about 0.0175 inch. For supporting a substrate of about 6–8 inches in diameter, the diameter of the inner edge 42 is typically about 0.4–0.6 inch, the diameter of the step 48 is typically about 0.65–0.85 inch, and the diameter of the outer edge 40 is typically about 0.9–1.1 inch. In a specific embodiment, the inner edge 42 has a diameter of about 0.5 inch, the step 48 has a diameter of about 0.75 inch, and the outer edge 40 has a diameter of about 1 inch. The inner edge 42 and the step 48 are preferably rounded to eliminate sharp edges and the contact surface area 44 which makes contact with the substrate is preferably smooth without any burrs. In a preferred embodiment, all edges of the end effector 10 are rounded or smoothed to eliminate sharp edges.

The contact member 26 may be attached to the proximal end portion 14 of the end effector body 12 using any suitable means. In a specific embodiment, a slot or seat 50 is provided in the proximal end portion 14 for receiving the contact member or insert 26, as best seen in FIG. 3. The insert slot 50 preferably has a shape that is complementary to the outer edge 40 of the contact insert 26. The insert slot 50 may have a depth that is approximately equal to the height of the outer annular area 46 so that when the contact member 26 is inserted into the slot 50, the outer annular area 46 is generally coplanar with the top surface of the proximal end portion 14. In one embodiment, double-sided adhesive tape is used to attach the bottom of the contact insert 26 to the insert slot 50.

In use, a substrate is positioned on and supported by the contact surface area 44 of the contact member 26. The bottom opening 30 of the vacuum strip 28 is coupled with a vacuum pump to draw a vacuum on the bottom of the substrate through the vacuum aperture 36, the top opening 32, and the vacuum channel 34. In this way, the end effector 10 operates as a vacuum pick for positioning the substrate. Advantageously, the smooth contact surface area 44 and the rounded, circular inner edge 42 and step 48 provide a contact with the substrate that is smooth with no sharp discontinuities, thereby minimizing boundary effects and stress concentrations. The size and shape of the contact surface area 44 are selected to provide stable support for the substrate. The size of the contact surface area 44 is minimized so as to minimize heat conduction. The diameter of the inner edge 42 should not be too large, however, because the vacuum may deform the substrate by pulling it down into the slot 50 and cause local stresses to build up in the substrate and damage the substrate.

Another way to reduce heat conduction is to make the contact member 26 out of a material that has a low thermal conductivity. The contact member 26 may be made of a ceramic such as $Al_2O_3$ which has a thermal conductivity that is about ⅕ of the thermal conductivity of steel. The end effector body 12 may also be made of a ceramic material, but is typically made of a metal such as steel which generally is stronger and costs less than ceramics. In a specific embodiment, the end effector body 12 and vacuum strip 28 are made of 304 stainless steel and the contact member 26 is made of $Al_2O_3$.

When the substrate is supported by the contact surface area 44 of the contact member 26, a portion of the bottom of the substrate overlaps in position with the proximal end portion 14 and intermediate portion 22 of the end effector body 12. The remaining portion of the substrate which does not overlap in position with the end effector body 12 is exposed at the bottom to the surroundings so that heat transfer by radiation occurs more freely in the exposed portion than in the overlapped portion of the substrate. This contributes to a temperature gradient in the substrate due to the difference in heat transfer between the overlapped and exposed portions. One way to reduce this effect is to provide a plurality of apertures 24 in the intermediate portion 22 of the end effector body 12 as shown in FIGS. 1–3. The size, shape, and number of the apertures 24 can be optimized for particular situations. In general, it is desirable to have a larger number of apertures, for instance, at least about 10 apertures, and more desirably about 20–40 apertures. FIGS. 1–3 show 28 apertures 24 that are generally circular and equal in size. The distribution of the apertures 24 is generally uniform. At least some of the apertures 24 overlap with the substrate to provide open areas while the solid part of the end effector body 12 overlaps with the substrate to provide a blocked area. The ratio of the sum of the open areas to the blocked area is typically less than about 1. In a specific embodiment, the ratio is about 0.2.

The above-described arrangements of apparatus and methods are merely illustrative of applications of the principles of this invention and many other embodiments and modifications may be made without departing from the spirit and scope of the invention as defined in the claims. For instance, the end effector body 12 and the contact member 26 may be made of the same material and may be integrally formed as a single body. The contact member 26 may have other shapes and may be formed without the step 48 so that the annular surface defined between the outer edge 40 and the inner edge 42 constitutes the entire contact surface area 44 for contacting the substrate.

What is claimed is:

1. An end effector for handling a substrate, the end effector comprising:

an end effector body having a proximal end portion and a distal end portion, the end effector body having an upper surface and a lower surface, the end effector body including at least one aperture disposed between the proximal end portion and the distal end portion and extending from the lower surface to the upper surface; and a contact member coupled with the proximal end portion of the end effector body for contacting a substrate over a contact surface area which is smaller in size than the surface of the substrate facing the contact member and spacing the substrate from the end effector body so that the substrate does not contact the upper and lower surfaces of the end effector body, the at least one aperture of the end effector body overlapping in position with a portion of the substrate and being vertically spaced from the portion of the substrate when the substrate is in contact with the contact member.

2. The end effector of claim 1 wherein the contact member is coupled with a proximal end surface of the proximal end portion of the end effector body to space the substrate from the proximal end surface of the proximal end portion.

3. The end effector of claim 2 wherein the contact member spaces the substrate from the proximal end surface of the proximal end portion by a gap which is at least about 0.01 inch.

4. The end effector of claim 2 wherein the contact member spaces the substrate from the proximal end surface of the proximal end portion by a gap which is less than about 0.025 inch.

5. The end effector of claim 1 wherein the contact member has an outer edge which is generally circular.

6. The end effector of claim 5 wherein the contact member has an inner edge defining an opening which is generally circular and an annular surface defined between the inner edge and the outer edge.

7. The end effector of claim 6 wherein the contact surface area is at east a portion of the annular surface of the contact member.

8. The end effector of claim 7 wherein the contact surface area is an annular area having an inner boundary which corresponds to the inner edge of the contact member and an outer boundary which is spaced inwardly from the outer edge of the contact member, a remainder of the annular surface of the contact member forming an outer annular area surrounding the contact surface area, the outer annular area having an inner boundary which corresponds to the outer boundary of the contact surface area and an outer boundary which corresponds to the outer edge of the contact member.

9. The end effector of claim 8 wherein the outer boundary of the contact surface area has a diameter of about 0.65–0.85 inch.

10. The end effector of claim 6 wherein the inner edge of the contact member has a diameter of about 0.4–0.6 inch.

11. The end effector of claim 6 wherein the proximal end portion of the end effector body includes a vacuum aperture which corresponds in position to the opening of the contact member.

12. The end effector of claim 11 wherein the end effector body includes a vacuum channel extending from the proximal end portion to the distal end portion for coupling the vacuum aperture in the proximal end portion with a vacuum source.

13. The end effector of claim 5 wherein the outer edge of the contact member has a diameter of about 0.9–1.1 inch.

14. The end effector of claim 1 wherein the contact member is disposed at least partially in a slot in the proximal end portion.

15. The end effector of claim 1 wherein the end effector body includes a plurality of apertures disposed between the proximal end portion and the distal end portion and extending from the lower surface to the upper surface of the end effector body and distributed generally uniformly, at least some of the plurality of apertures being disposed to overlap in position with a portion of the substrate when the substrate is supported by the contact member.

16. The end effector of claim 15 wherein the plurality of apertures are generally circular.

17. The end effector of claim 15 wherein the end effector body has a solid portion surrounding the plurality of apertures, the plurality of apertures overlapping in position with the portion of the substrate over a first overlapped area, the solid portion overlapping in position with another portion of the substrate over a second overlapped area, the first overlapped area being less than the second overlapped area.

18. The end effector of claim 15 wherein the end effector body comprises at least about 10 apertures between the proximal end portion and the distal end portion.

19. The end effector of claim 1 wherein the end effector body comprises steel.

20. The end effector of claim 1 wherein the contact member comprises a material having a thermal conductivity which is lower than the thermal conductivity of steel.

21. The end effector of claim 20 wherein the contact member comprises a ceramic material having a thermal conductivity which is substantially lower than the thermal conductivity of steel.

22. An end effector for handling a substrate, the end effector comprising:

an end effector body having a proximal end portion and a distal end portion, the end effector body including at least one aperture disposed between the proximal end portion and the distal end portion; and a contact member coupled with the proximal end portion of the end effector body for contacting a substrate over a contact surface area which is smaller in size than the surface of the substrate facing the contact member and spacing the substrate from the end effector body, the at least one aperture of the end effector body overlapping in position with a portion of the substrate when the substrate is in contact with the contact member, the contact member having an outer edge which is generally circular, the contact member having an inner edge defining an opening which is generally circular and an annular surface defined between the inner edge and the outer edge, the contact surface area being at least a portion of the annular surface of the contact member, wherein the contact surface area is an annular area having an inner boundary which corresponds to the inner edge of the contact member and an outer boundary which is spaced inwardly from the outer edge of the contact member, a remainder of the annular surface of the contact member forming an outer annular area surrounding the contact surface area, the outer annular area having an inner boundary which corresponds to the outer boundary of the contact surface area and an outer boundary which corresponds to the outer edge of the contact member, wherein the outer boundary of the contact surface area forms a step between the contact surface area and the outer annular area such that the contact surface area protrudes from the outer annular area.

23. The end effector of claim 22 wherein the step has a height of about 0.01–0.025 inch.

24. An end effector for handling a substrate, the end effector comprising:
 an end effector body having a proximal end portion and a distal end portion, the end effector body having an upper surface and a lower surface, the end effector body comprising a body material; and
 a support member coupled with the proximal end portion of the end effector body for supporting a substrate and spacing the substrate from the end effector body so that the, substrate does not contact the upper and lower surfaces of the end effector body, the support member comprising a support member material having a thermal conductivity which is lower than the thermal conductivity of the body material.

25. The end effector of claim 24 wherein the proximal end portion has a proximal end surface and the support member has a support surface which is at least substantially planar for spacing the substrate from the proximal end surface by a gap.

26. The end effector of claim 25 wherein the gap is between about 0.01–0.025 inch.

27. The end effector of claim 25 wherein the support surface is annular in shape.

28. The end effector of claim 27 wherein the annular support surface includes a generally circular outer boundary having a diameter of about 0.65–0.85 inch and a generally circular inner boundary having a diameter of about 0.4–0.6 inch.

29. The end effector of claim 27 wherein the annular support surface includes an outer boundary having a rounded annular edge and an inner boundary having another rounded annular edge.

30. The end effector of claim 24 wherein the body material includes steel.

31. The end effector of claim 24 wherein the support member material includes ceramic.

32. The end effector of claim 24 wherein the end effector body includes a plurality of apertures disposed between the proximal end portion and the distal end portion and extending from the lower surface to the upper surface of the end effector body, at least some of the plurality of apertures overlapping in position with the portion of the substrate and being spaced from the portion of the substrate when the substrate is supported by the support member.

33. The end effector of claim 24 further comprising means for coupling the proximal end portion of the end effector body to a vacuum source for pulling a vacuum on the substrate and positioning the substrate on the support member.

* * * * *